United States Patent
Broussev et al.

(10) Patent No.: US 9,048,730 B2
(45) Date of Patent: Jun. 2, 2015

(54) SWITCHED MODE POWER SUPPLY AND A METHOD FOR OPERATING A SWITCHED MODE POWER SUPPLY

(75) Inventors: Svetozar Broussev, Tampere (FI); Jani Jaervenhaara, Tampere (FI); Nikolay Tchamov, Tampere (FI)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/495,067

(22) Filed: Jun. 13, 2012

(65) Prior Publication Data

US 2013/0336011 A1 Dec. 19, 2013

(51) Int. Cl.
*H02M 3/158* (2006.01)
*H03K 17/10* (2006.01)
*H02M 1/00* (2006.01)

(52) U.S. Cl.
CPC .... *H02M 3/1588* (2013.01); *H02M 2001/0054* (2013.01); *H03K 17/102* (2013.01); *H03K 2217/0063* (2013.01); *Y02B 70/1466* (2013.01); *Y02B 70/1491* (2013.01)

(58) Field of Classification Search
CPC . H02M 3/1588; H02M 3/158; H02M 3/1582; H02M 3/1584; H02M 3/156; H02M 3/10; H02M 3/155
USPC .................. 323/265, 268, 271, 223, 225, 290
See application file for complete search history.

(56) References Cited

U.S. PATENT DOCUMENTS

| | | | | |
|---|---|---|---|---|
| 3,351,848 A | * | 11/1967 | Lodder | 323/222 |
| 4,800,476 A | * | 1/1989 | Harada et al. | 363/16 |
| 5,592,367 A | * | 1/1997 | Sugimori et al. | 363/17 |
| 6,215,290 B1 | * | 4/2001 | Yang et al. | 323/282 |
| 6,249,156 B1 | * | 6/2001 | Attwood | 327/110 |
| 6,304,065 B1 | | 10/2001 | Wittenbreder | |
| 6,429,632 B1 | | 8/2002 | Forbes et al. | |
| 6,819,088 B2 | | 11/2004 | Shenai et al. | |
| RE40,907 E | | 9/2009 | Steigerwald et al. | |
| 7,672,147 B1 | | 3/2010 | Schutten et al. | |
| 7,791,905 B2 | * | 9/2010 | Smet et al. | 363/18 |
| 7,839,667 B2 | * | 11/2010 | Liao et al. | 363/97 |
| 8,030,909 B2 | | 10/2011 | Ma et al. | |
| 8,063,671 B2 | * | 11/2011 | Xiao | 327/109 |
| 8,212,537 B2 | * | 7/2012 | Carpenter et al. | 323/225 |
| 8,248,047 B2 | | 8/2012 | Zhou | |

(Continued)

OTHER PUBLICATIONS

U.S. Appl. No. 13/495,108, filed Jun. 13, 2012.

(Continued)

*Primary Examiner* — Matthew Nguyen
*Assistant Examiner* — Kyle J Moody
(74) *Attorney, Agent, or Firm* — Eschweiler & Associates, LLC

(57) ABSTRACT

A switched mode power supply provides a reduction of switching losses and increased efficiency. The switched mode power supply includes a first switch coupled to an input terminal configured to receive an input voltage, a second switch, an inductor and an output capacitor. The first switch and the second switch are coupled together at a node, the inductor is coupled between the node and an output terminal, and the output capacitor is coupled to the output terminal. The switched mode power supply further includes a transformer coupled between a control input of the first switch and the node and a pulse generator connected to a control input of the second switch. Further, the transformer includes at most two windings, in particular a primary winding and a secondary winding which are not directly connected to each other.

23 Claims, 7 Drawing Sheets

(56) References Cited

U.S. PATENT DOCUMENTS

| | | | |
|---|---|---|---|
| 8,369,109 B2* | 2/2013 | Niedermeier et al. | 363/17 |
| 8,436,594 B2 | 5/2013 | Fu et al. | |
| 8,536,803 B2* | 9/2013 | Sadwick et al. | 315/307 |
| 8,587,269 B2 | 11/2013 | Salato | |
| 2003/0234636 A1 | 12/2003 | Ruan et al. | |
| 2004/0027101 A1 | 2/2004 | Vinciarelli | |
| 2004/0100805 A1 | 5/2004 | Wei et al. | |
| 2006/0012348 A1 | 1/2006 | Zhao et al. | |
| 2006/0091871 A1 | 5/2006 | Abedinpour et al. | |
| 2008/0012542 A1 | 1/2008 | Liu et al. | |
| 2008/0157691 A1 | 7/2008 | Lu et al. | |
| 2008/0180077 A1 | 7/2008 | Qiu et al. | |
| 2010/0181970 A1 | 7/2010 | Yang et al. | |
| 2010/0225287 A1 | 9/2010 | Schultz | |
| 2010/0246231 A1 | 9/2010 | Sirio et al. | |
| 2011/0204858 A1 | 8/2011 | Kudo | |
| 2011/0316503 A1 | 12/2011 | Huang | |
| 2012/0068675 A1 | 3/2012 | Kawagishi et al. | |
| 2012/0068676 A1 | 3/2012 | Kawagishi et al. | |
| 2012/0112715 A1 | 5/2012 | Tong et al. | |
| 2012/0126777 A1 | 5/2012 | Motegi | |
| 2012/0146600 A1 | 6/2012 | Xu et al. | |
| 2012/0212196 A1 | 8/2012 | Ozasa | |
| 2013/0280879 A1 | 10/2013 | Stecher et al. | |
| 2013/0335048 A1 | 12/2013 | Herzog et al. | |

OTHER PUBLICATIONS

U.S. Appl. No. 13/495,089, filed Jun. 13, 2012.
P.C. Theron et al., "Soft Switching Self-Oscillating IGBT-Based DC-DC Converters", IEEE, 2002, pp. 929-935.
Hiroshi Sakamoto et al., "Self Oscillated Pwm Converter with lmulse Resonant Soft-switching", IEEE, 2003, pp. 340-343.
C.F. Lee et al., "A Monolithic Current-Mode CMOS DC-DC Converter With On-Chip Current-Sensing Technique", IEEE, vol. 39, No. 1, pp. 3-14, 2004.
A. A. Fomani et al., "A Segmented Gate Driver with Adjustable Driving Capabilitiy for Efficiency Optimization", IEEE, 2010, pp. 1646-1650.
Jose F. da Rocha et al., "Level Shifters and Dcvsl for a Low-Voltage CMOS 4.2-V Buck Converter", IEEE, 2008, pp. 3315-3323.
A. Stratakos et al., "High-Efficiency Low-Voltage DC-DC Conversion for Portable Applications", Wiley-IEEE Press, 1998, ch. 12, pp. 361-397.
In Hwan Oh, "A Soft-Switching Synchronous Buck Converter for Zero Voltage Switching (ZVS) in Light and Full Load Conditions", IEEE, pp. 1460-1464, 2008.
Ehsan Adib et al., "Zero-Voltage-Transition PWM Converters With Synchronous Rectifier", IEEE, vol. 23, No. 1, 2010, pp. 105-110.
Hong Mao et al., "Zero-Voltage-Switching DC-DC Converters With Synchronoius Rectifiers", IEEE, vol. 23, No. 1, 2008, pp. 369-378.
N. Lakshminarasamma et al., "A Family of Auxiliary Switch ZVS-PWM DC-DC Converters With Coupled Inductor", IEEE, vol. 22, No. 5, 2007,0 pp. 2008-2017.
K. I. Hwu et al., "Simple Design of a Soft-Switching Buck Converter", IEEE, 2008, pp. 410-414.
Yingqi Zhang et al., "A New Soft-Switching Technique for Buck, Boost, and Buck-Boost Converters", IEEE, vol. 39, No. 6, 2003, pp. 1775-1782.
Mehdi Alimadadi et al., "A 3GHz Switching DC-DC Vonverter Unsing Clock-Tree Charge-Recycling in 90nm CMOS with Integrated Output Filter", IEEE, 2007, pp. 532, 533, 620.
William a Peterson et al., "A Half Bridge, Self-Oscillating, Multi-Resonant Converter Circuit", IEEE, 1993, pp. 77-84.
Non-Final Office Action dated Jan. 16, 2014 for U.S. Appl. No. 13/495,089. 44 Pages.
Final Office Action Dated May 9, 2014 U.S. Appl. No. 13/495,089.
Non Final Office Action Dated Sep. 23, 2014 U.S. Appl. No. 13/495,108.
Non Final Office Action Dated Sep. 22, 2014 U.S. Appl. No. 13/495,089.
Notice of Allowance Dated Jan. 22, 2105 U.S. Appl. No. 13/495,108.
Final Office Action Dated Jan. 15, 2015 U.S. Appl. No. 13/495,089.
Notice of Allowance dated Apr. 16, 2014 for U.S. Appl. No. 13/495,089.

* cited by examiner

US 9,048,730 B2

SWITCHED MODE POWER SUPPLY AND A METHOD FOR OPERATING A SWITCHED MODE POWER SUPPLY

FIELD

The present invention relates to a switched mode power supply, a DC to DC converter, and a method for operating a switched mode power supply.

BACKGROUND

The power supply and voltage regulations for devices such as, for example, a central processing unit, a memory, or peripheral loads becomes a major challenge due to increasing demands in computing platforms. Recent years show an increasing demand for power supplies and power converters operating at high frequencies. In general it is desired to increase the switching frequency of the power supply. The increased switching frequency, however, causes more switching losses of the power switches which leads to lower converter efficiency. Therefore, one important challenge to power supply is a reduction of the switching losses and to increase the efficiency.

BRIEF DESCRIPTION OF THE DRAWINGS

The accompanying drawings are included to provide a further understanding of the disclosure and are incorporated in and constitute a part of this specification. The drawings illustrate embodiments and together with the description serve to explain principles of the disclosure. Other variations and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
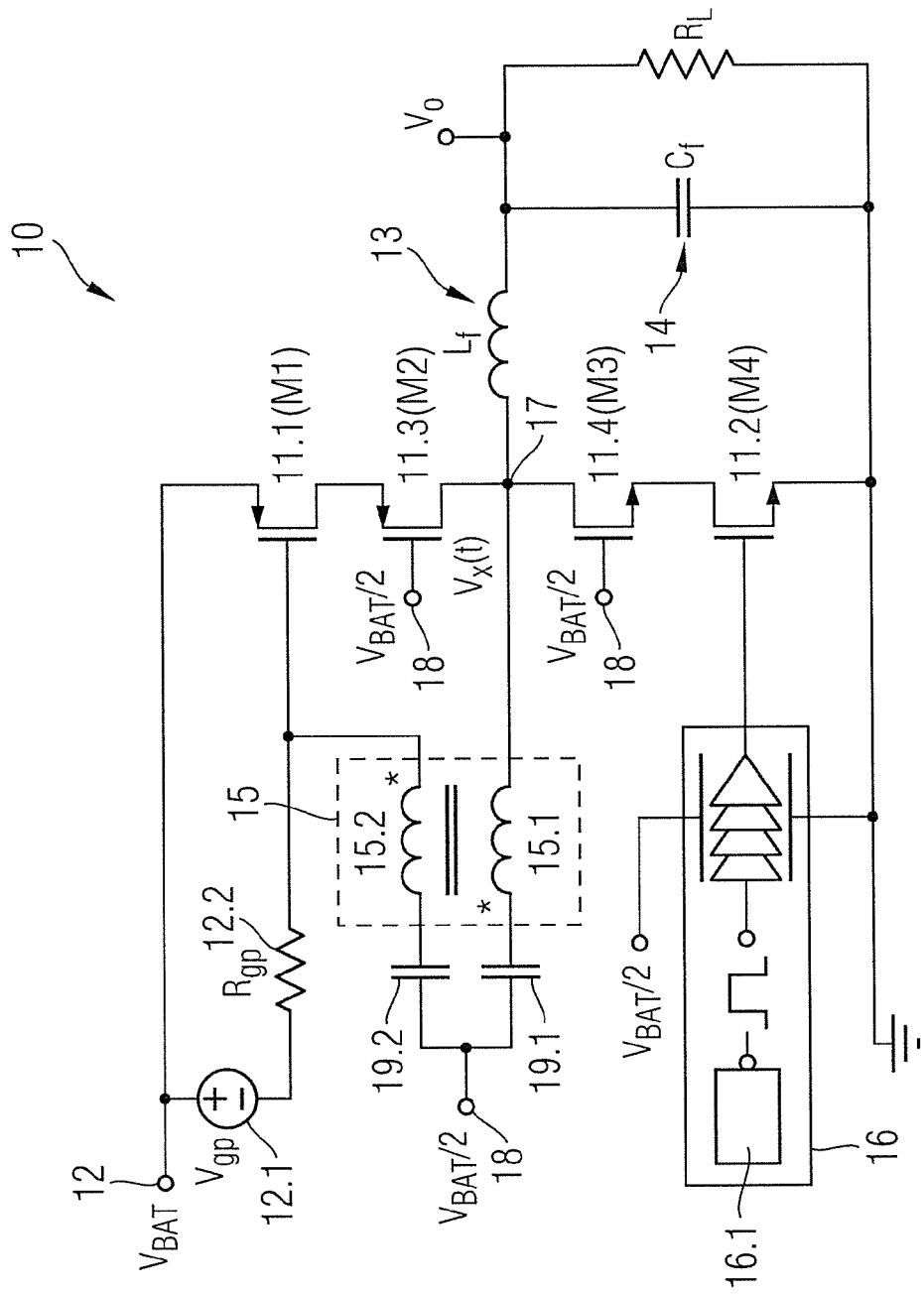
FIG. 1 illustrates a circuit representation of an exemplary switched mode power supply according to the disclosure.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the disclosure. It may be evident, however, to one skilled in the art that one or more aspects of the embodiments may be practiced with a lesser degree of the specific details. In other instances, known structures and elements are shown in schematic form in order to facilitate describing one or more aspects of the disclosure. It is to be understood that other embodiments may be utilized and structural or logical changes may be made without departing from the scope of the disclosure. It should be noted further that the drawings are not to scale or not necessarily to scale.

In addition, features or aspects disclosed may be combined with one or more other features or aspects of the other implementations as may be desired and advantageous for any given or particular application. The terms "coupled" and "connected", along with derivatives may be used. It should be understood that these terms may be used to indicate that two elements co-operate or interact with each other regardless whether they are in direct physical or electrical contact, or they are not in direct contact with each other. The following detailed description, therefore, is not to be taken in a limiting sense, and the scope of the present invention is defined by the appended claims.

The following disclosure is directed to a switched-mode power supply or a power supply circuit. It is to be noted herewith that different kinds of power supplies can be used like, for example, direct current to direct current power converter circuits like buck converter circuits, boost converter circuits, or buck-boost converter circuits, direct current to alternate current converter circuits, or alternate current to direct current converter circuits.

FIG. 1 illustrates a circuit representation of an exemplary switched mode power supply according to the disclosure. The switched mode power supply 10 of FIG. 1 comprises a first switch 11.1 ($M_1$) connected to an input terminal 12 for inputting an input voltage $V_{BAT}$, a second switch 11.2 ($M_4$), an inductor 13 ($L_f$) and an output capacitor 14 ($C_f$). The switched mode power supply 10 further comprises a transformer 15 connected to the first switch 11.1 ($M_1$) and a pulse generator 16 connected to the second switch 11.2 ($M_4$).

In the switched mode power supply 10 of FIG. 1, second switch 11.2 may be connected to ground. First switch 11.1 may be configured to switch input voltage $V_{BAT}$ to a node 17 between first and second switches 11.1 and 11.2. Second switch 11.2 may be configured to switch the ground potential to the node between first and second switches 11.1 and 11.2. Pulse generator 16 may be configured to drive second switch 11.2 with a pulse width modulated signal. Transformer 15 may be configured to feed back a potential of the node 17 between first and second switches 11.1 and 11.2 and to drive first switch 11.1 with the fed back potential.

The switched mode power supply 10 of FIG. 1 can be operated as a DC to DC converter in which the first and second switches 11.1 and 11.2 can be configured as MOS transistors, in particular power MOS transistors. The input voltage $V_{BAT}$ is supplied to input terminal 12 which is connected with an input terminal of first switch 11.1 and is converted to an output voltage $V_O$ which can be applied to a load $R_L$. Inductor 13 is connected to the node 17 between first and second switches 11.1 and 11.2. The first and second switches 11.1 and 11.2 can be switched on and off with driving signals whose duty-cycle regulate the output voltage $V_O$ of the converter.

The switched mode power supply 10 may have been fabricated by CMOS technology, for example. Switched mode power supply 10 may further comprise a third switch 11.3 ($M_2$) and a fourth switch 11.4 ($M_3$) wherein third switch 11.3 is connected between first switch 11.1 and node 17, and fourth switch 11.4 is connected between node 17 and second switch 11.2. Third and fourth switches 11.3 and 11.4 are thus connected in a cascode configuration with first and second switches 11.1 and 11.2, respectively, to solve the breakdown problem of advanced CMOS processes. Third and fourth switches 11.3 and 11.4 can be connected to an input node 18 providing a voltage $V_{BAT}/2$. It should be added that each one of the third and fourth switches can be replaced by two or more respective switches for further enhancing the withstand voltage or further reducing the break-down problem.

Transformer 15 may comprise a primary winding 15.1 ($L_{pr}$) and a secondary winding 15.2 ($L_{sec}$), and primary winding 15.1 may be connected with node 17 and secondary winding 15.2 may be connected with a control input of first switch 11.1, i.e. a gate electrode of power MOS transistor 11.1, for example.

Switched mode power supply 10 may further include a first capacitor 19.1 ($C_{r2}$) and a second capacitor 19.2 ($C_{r1}$) wherein first capacitor 19.1 may be connected between primary winding 15.1 and input node 18, and second capacitor 19.2 may be connected between secondary winding 15.2 and input node 18, and input node 18 provides a voltage $V_{BAT}/2$.

Switched mode power supply 10 may further include an auxiliary voltage source 12.1 ($V_{gp}$) and an auxiliary resistor 12.2 ($R_{gp}$), wherein auxiliary voltage source 12.1 may be connected between auxiliary resistor 12.2 and input terminal 12 and auxiliary resistor 12.2 may be connected between auxiliary voltage source 12.1 and first switch 11.1.

Pulse generator 16 may include a pulse width modulator 16.1 to generate a pulse width modulated (PWM) signal comprising an adjustable duty cycle.

Switched mode power supply 10 comprises an architecture which performs self-timing in a self-triggered fashion. Transformer 15 acts as a high-side driver which creates the driving pulse for first switch 11.1 whereas pulse generator 16 acts as a low-side driver by delivering the input pulse-width-modulated (PWM) signal to a control terminal of second switch 11.2, i.e. to a gate electrode of power MOS transistor 11.2., for example. Output voltage $V_O$ is regulated for line or load variations by adjusting the duty-cycle of the PWM signal. In particular, switches 11.1 to 11.4 may be configured as power MOS transistors, input voltage $V_{BAT}$ may be a battery voltage, inductor 13 as a filtering inductor, output capacitor 14 as an output filtering capacitor, transformer 15 as a feedback transformer, and capacitors 19.1 and 19.2 as large decoupling capacitors.

Figure 2C:
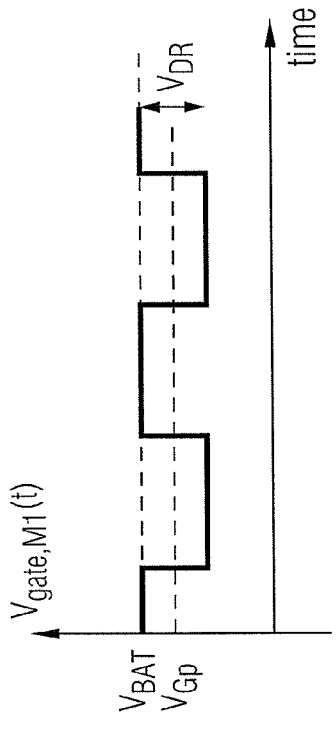
FIGS. 2a-2d illustrate exemplary voltage wave forms at different points of the switched mode power supply of FIG. 1.
Figure 2D:
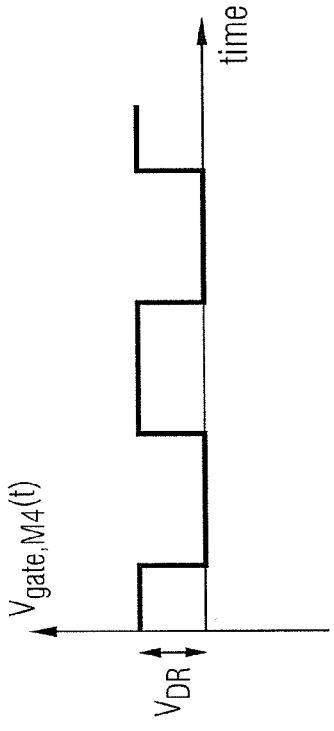
Figure 2A:
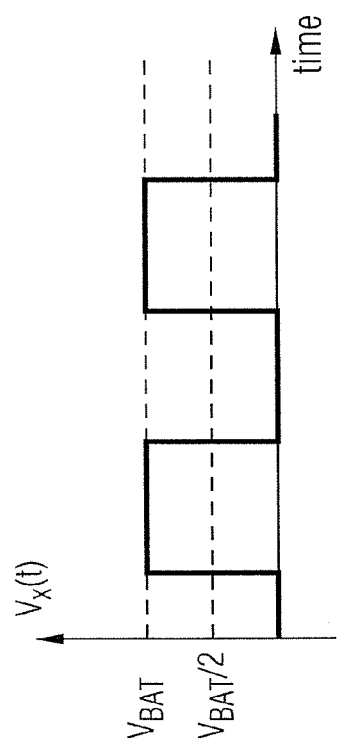
Figure 2B:
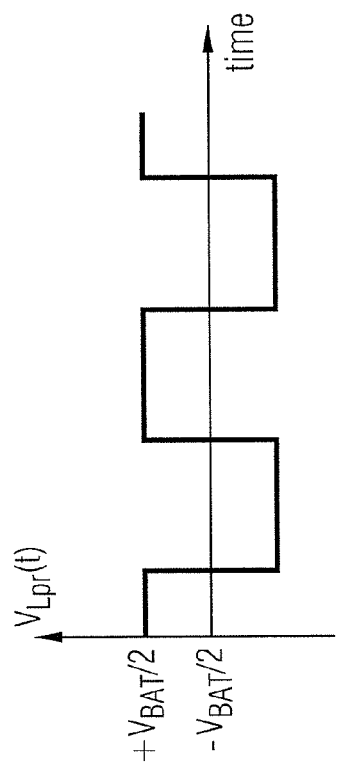

FIGS. 2a-2d illustrate voltage wave forms of switched mode power supply 10 in order to illustrate its principle of operation. The voltage $V_x(t)$ at node 17 toggles between $V_{BAT}$ and ground with a duty-cycle controlled by the input PWM signal. The square wave $V_x(t)$ voltage shown in FIG. 2a is filtered with inductor 13 and output capacitor 14 to obtain output voltage $V_O$. First and second capacitors 19.1 and 19.2 are large enough so that their voltage remains nearly constant during the charging and discharging currents of primary and secondary windings 15.1 and 15.2 of transformer 15. If $V_x(t)$ at node 17 toggles with 50% duty-cycle such as shown in FIG. 2a, then the voltage drop over capacitors 19.1 and 19.2 is about zero. The voltage difference between $V_x(t)$ and $V_{BAT}/2$ is applied to primary winding 15.1 of feedback transformer 15 and it also has a square-wave shape as shown in FIG. 2b. A scaled version of the voltage over primary winding 15.1 is transferred to the gate of transistor 11.1 through the operation of transformer 15 such as shown in FIG. 2c. The amplitude of the gate voltage at first switch 11.1 depends on the values of $L_{pr}$, $L_{sec}$ and the mutual coupling between them. The wave form is centered around the voltage $V_{Gp}$ and $V_{Gp}$ should be equal to $V_{BAT}-V_{DR}/2$ such that the gate of first switch 11.1 receives voltage amplitude equal to $V_{DR}$ as shown in FIG. 2d, where $V_{DR}$ is the maximum driving voltage supplied to the control terminal of second switch 11.2. The orientation of the primary and secondary windings 15.1 and 15.2 of transformer 15 is such when $V_x(t)$ starts falling from $V_{BAT}$ to zero, the $M_1$ gate receives a signal which turns off $M_1$. Similarly, the transistor $M_1$ is switched on by detecting a small increase of $V_x$ which is further amplified to make an avalanche type of switching process.

During the initial start-up of the circuit, $V_{Gp}$ should provide an opening pulse for the $M_1$ transistor 11.1 in order to initiate the switching process. $V_{Gp}$ should be set to $(V_{BAT}-V_{DR}/2)$ after the start-up. The auxiliary voltage source 12.1 ($V_{Gp}$) and the auxiliary resistor 12.2 ($R_{Gp}$) do not dissipate visible power and provide only the dc condition for the proper operation of the converter. The DC voltage $V_{Gp}$ could be used for fine adjustment of the DC level of the $M_1$ pulse such that it is in accordance with the duty-cycle of the converter.

The transition of $V_x$ node from $V_{BAT}$ to zero can be initiated by the input PWM pulse which turns on the switches 11.2 and 11.4. Because of the non-ideal transformer, capacitors and circuitry around first switch 11.1, the turning-off process may be initiated also by the transient process in the high-side driver. From efficiency point of view, the self-initiation of this process should display better efficiency since the short-currents associated with the forced transition would be eliminated. Nevertheless, the forced transitions initiated by the input PWM pulse help regulating the output voltage $V_0$. The transition of $V_x$ node from zero to $V_{BAT}$ is initiated only by the transient processes in the high-side control circuitry.

It is to be understood that switches 11.1 and 11.3 can be configured as PMOS transistors and switches 11.2 and 11.4 can be configured as NMOS transistors such as shown in FIG. 1.

It should be noted that transformer 15 does not carry large currents so that its quality factor is not significantly critical for the converter efficiency.

The value of the first and second capacitors 19.1 and 19.2 can be in the order of hundreds of pF as, for example, in a range of 100 pF-500 pF. However, the capacitance may depend on the specific details of the circuit like, for example, the switching frequency.

It should be noted that in another example of a switched mode power supply, namely a self-oscillating converter, a main winding of a transformer is connected between the switching node and the midpoint of large capacitors, a further winding of the transformer is connected between the input voltage and the first switch, and a further winding is connected between ground and the second switch.

Figure 3:
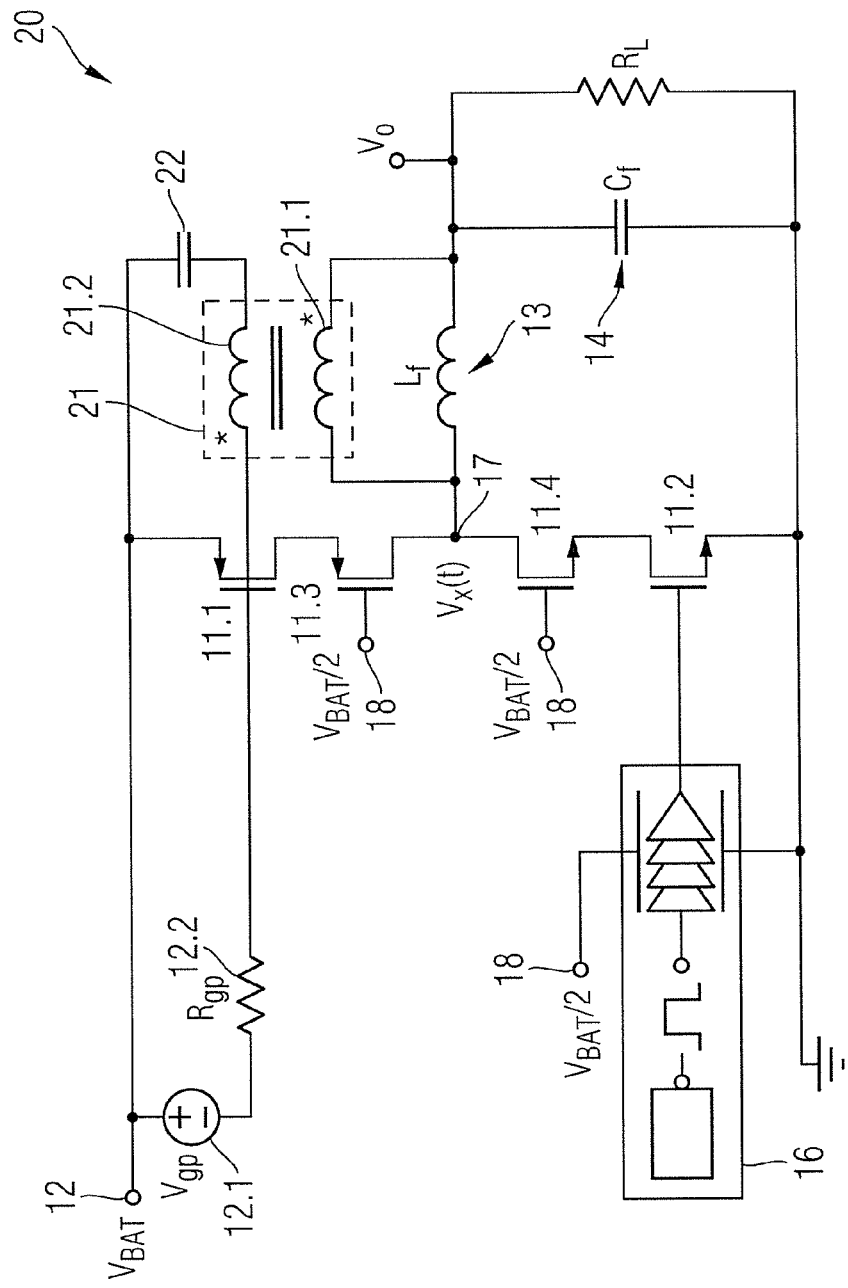
FIG. 3 illustrates a circuit representation of an exemplary switched mode power supply according to the disclosure.

FIG. 3 illustrates a circuit representation of a switched mode power supply according to the disclosure. Switched mode power supply 20 avoids the need of the two large capacitors 19.1 and 19.2 of switched mode power supply 10 of FIG. 1 and the reference voltage $V_{BAT}/2$ supplied to them. Instead, switched mode power supply 20 includes a transformer 21 having a primary winding 21.1 and a secondary winding 21.2 wherein primary winding 21.1 is connected in parallel to inductor 13. More specifically, primary winding 21.1 is connected between node 17 and converter output $V_0$. Secondary winding 21.2 is connected between an auxiliary capacitor 22 ($C_r$) and the gate of transistor 11.1. The output voltage $V_0$ of the converter is used for a voltage reference instead of $V_{BAT}/2$. Only one capacitor 22 is needed for secondary winding 21.2 which transfers the feedback signal to the high-side power transistor 11.1. The purpose of the auxiliary voltage source 12.1 and the auxiliary resistor 12.2 is the same as in switched mode power supply 10 of FIG. 1, i.e. the duty-cycle of the high-side driver can be adjusted by changing the DC level of $V_{Gp}$.

Primary winding 21.1 is connected in parallel with the main filtering inductor 13, thus in one embodiment the transformer design should be done in a way that the converter operation is not influenced. This means that the inductance $L_{pr}$ of primary winding 21.1 should be bigger than the inductance $L_f$ of inductor 13 such that only a portion of the output current is carried to the output via $L_{pr}$. This should not be a big issue since the quality factor of $L_{pr}$ is not a limiting factor for achieving good efficiency, thus a multi-turn transformer can be used with small winding width in order to increase the inductance of $L_{pr}$ and $L_{sec}$.

Figure 4:
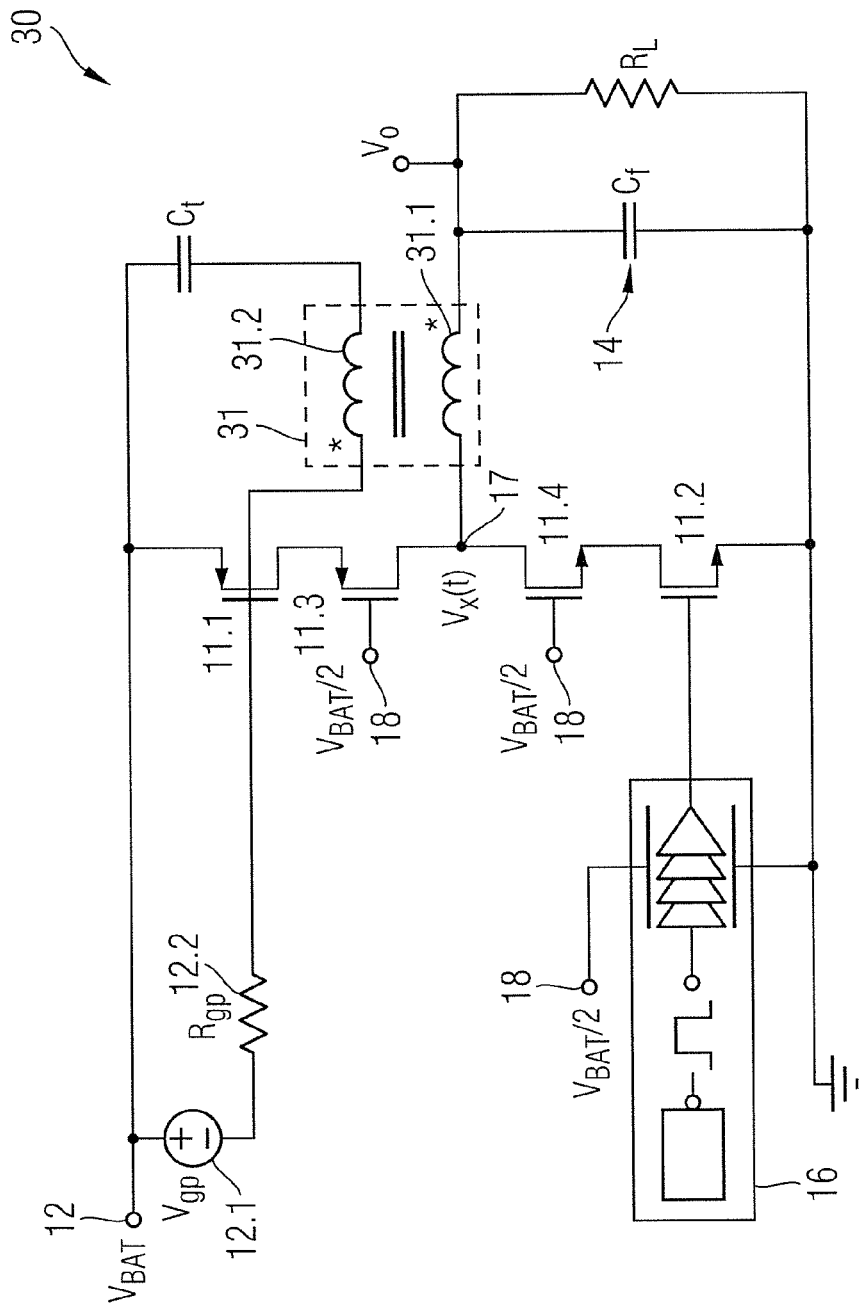
FIG. 4 illustrates a circuit representation of an exemplary switched mode power supply according to the disclosure.

FIG. 4 illustrates a circuit representation of a switched mode power supply according to the disclosure. Switched mode power supply 30 of FIG. 4 includes a transformer 31 comprising a primary winding 31.1 and a secondary winding 31.2. Primary winding 31.1 of feedback transformer 31 functions at the same time as the main filtering inductor of the converter in order to decrease the number of passive components of the device. Primary winding 31.1 of transformer 31 serves thus two functions: 1) to filter the output ripples and 2) to transfer the feedback signal to secondary winding 31.2 of transformer 31. The modification of switched mode power supply 30 saves silicon area by combining the main inductor with the feedback transformer. The operation of the converter is the same as the operation of the converters of switched mode power supplies 10 and 20 of FIGS. 2 and 3.

Figure 5:
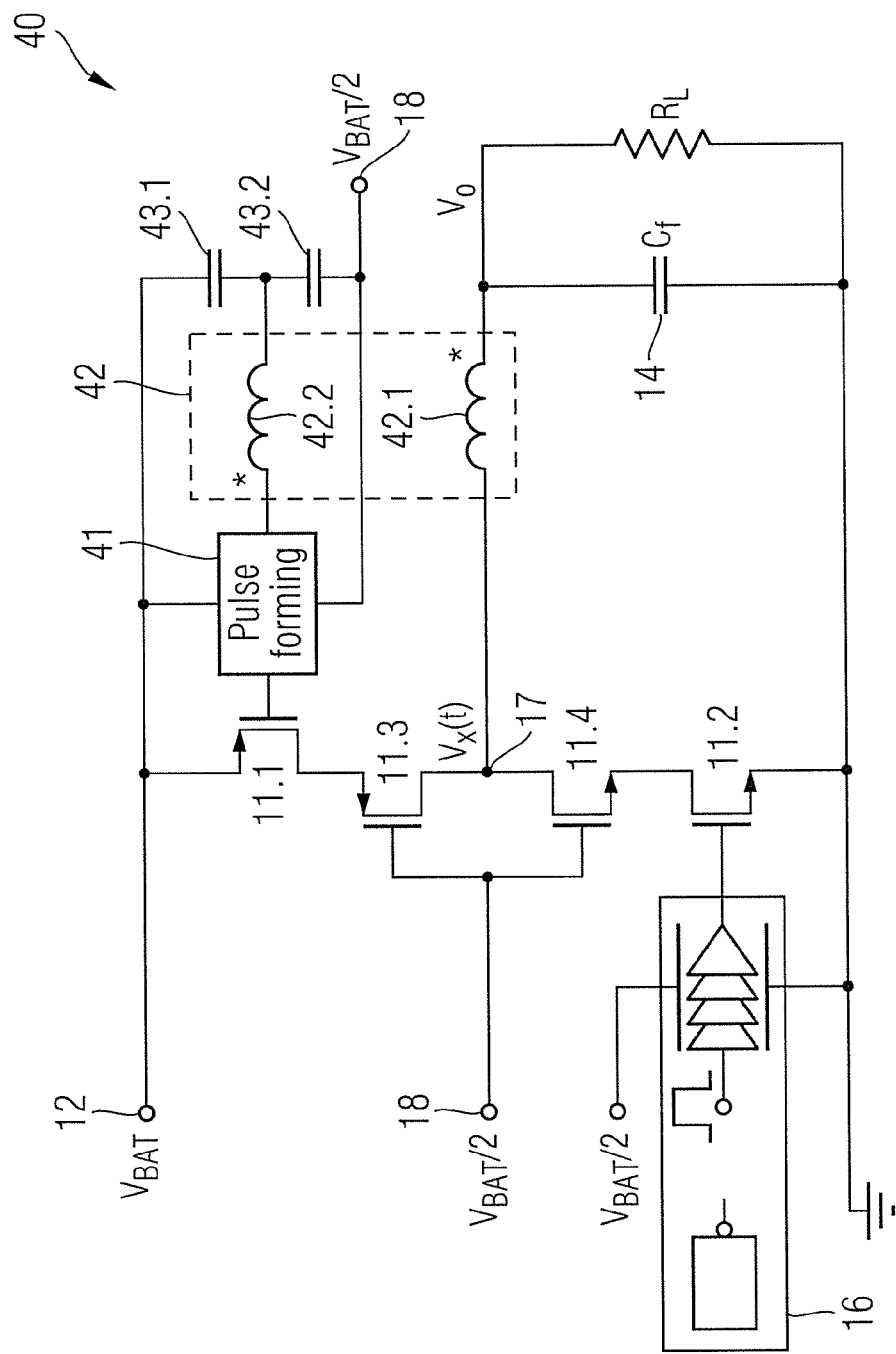
FIG. 5 illustrates a circuit representation of an exemplary switched mode power supply according to the disclosure.

FIG. 5 illustrates a circuit representation of a switched mode power supply according to the disclosure. The switched mode power supply 40 of FIG. 5 includes a transformer 42 having a primary winding 42.1 and a secondary winding 42.2, a first capacitor 43.1 ($C_{r1}$) and a second capacitor 43.2 ($C_{r2}$) and a pulse-forming block 41. In the previous examples of a switched mode power supply the secondary winding of the transformer is connected directly with the gate electrode of the first switch. In switched mode power supply 40 of FIG. 5, however, a pulse forming block 41 is inserted between secondary winding 42.2 of transformer 42 and the gate electrode of power transistor 11.1. The principle of operation of switched mode power supply 40 is the same as the operation of the previous examples of switched mode power supplies. The pulse forming block 41 isolates the potentially big capacitance of the first switch 11.1 from the secondary winding 42.1 of transformer 42. In this way, a square-wave $M_{1G}$ signal can be obtained rather than a sinusoidal signal. Thus, the pulse-forming block 41 shapes in a better way the $M_{1G}$ signal. Furthermore, since the input impedance of the pulse-forming block 41 is substantially bigger than the impedance of first switch 11.1, the secondary winding 42.2 carries very small current and the losses associated with the inductance $L_{sec}$ of secondary winding 42.2 are minor. Thanks to the high input impedance of the pulse-forming block 41 and the small current through the secondary winding 42.2, the values of the capacitors 43.1 and 43.2 can be significantly decreased to save silicon area.

The values of the first and second capacitors 43.1 and 43.2 is in the order of several pF as, for example, in the range of 1 pF-10 pF. However, the capacitance may depend on the specific details of the circuit like, for example, the switching frequency.

The advantages of the examples of switched mode power supplies described so far are as follows.

A reduced power loss by removing the high-side driver and the required voltage level shifters, which leads to higher achievable efficiency which is an improvement in comparison to the standard buck converter.

A level shifter is not required for the controlling of pulses supplied to the high-side power transistors and the associated time delay uncertainties normally associated with level shifters.

The voltage regulation is realized with a smooth regulation of the duty-cycle supplied to the NMOS switching devices which is an improvement in comparison to a self-oscillator.

A simple transformer can be used for the feedback operation so that a good quality factor is not required for the secondary winding, thus integration on silicon is feasible which is an improvement in comparison to a self-oscillating converter which requires a triple winding transformer.

Furthermore, dead-times that avoid short-circuit losses can be automatically obtained with no additional hardware or driving signal adjustment which is an improvement in comparison to a standard buck converter, which requires special arrangement of driving signals.

A further advantage is that the $V_{Gp}$ voltage in the embodiments of FIGS. 1, 3 and 4 can be used for adjustment of the gate voltage amplitudes for additional efficiency enhancement. Finally in the embodiment of FIG. 5, a silicon area reduction can be achieved by decreasing the values of the first and second capacitors 43.1 and 43.2 which is an improvement in comparison to a self-oscillating converter and the embodiments of FIGS. 1, 3 and 4.

Figure 6:
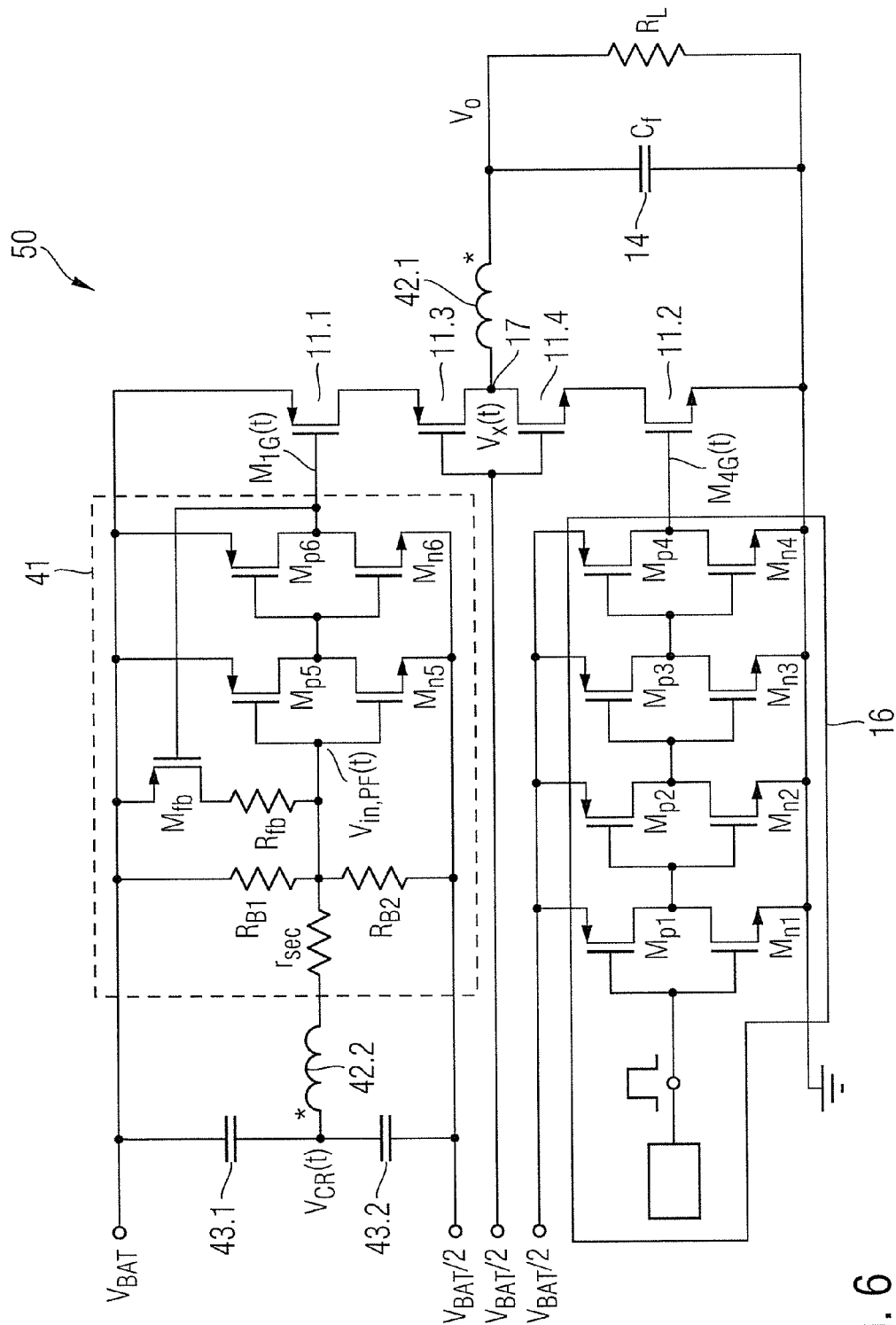
FIG. 6 illustrates a circuit representation of an exemplary switched mode power supply according to the disclosure.

FIG. 6 illustrates a circuit representation of a switched mode power supply according to the disclosure. Switched mode power supply 50 is based in principle on the architecture of switched mode power supply 40 of FIG. 5, wherein the pulse forming unit 41 and also the pulse generator 16 are shown in somewhat more detail in the switched mode power supply 50 of FIG. 6. The operation of the switched mode power supply 50 of FIG. 6 is as follows.

Simulations have shown that the driving signals applied to the power transistors 11.1 and 11.2 have a square-wave shape, which helps to achieve good converter efficiency. The dead-time between the signals $M_{1G}$ and $M_{4G}$ are created automatically by the converter to achieve a zero voltage switching operation. The duty-cycle of the input PWM signal controls only the duty-cycle of $M_{4G}$. When $M_{4G}$ goes to zero, the inductor current is negative, which is a required condition for achieving zero voltage switching (ZVS) operation. The negative inductor current charges the capacitance associated with the $V_x$ node 17, and the $V_x$ node voltage increases from zero to $V_{BAT}$. The rising front of the $V_x$ voltage is transferred as a falling front at the input of the pulse forming block 41, which triggers the high-side driver. The delay of two inverters used by the high-side driver provides the dead-time $t_{LH}$ needed for the $V_x$ node 17 to reach $V_{BAT}$ level in a ZVS fashion. The power transistor 11.1 is turned on after $t_{LH}$. The low-logic level of $M_{1G}$ switches on the feedback transistor 42 ($M_{fb}$), which pulls up the DC level of the input of the pulse forming block 41. After a transient process at the input of the pulse forming block 41, the voltage crosses a triggering level which terminates the opening pulse for power transistor 11.1. The duration of the ON pulse can be controlled via the feedback resistance $R_{fb}$. The $M_{4G}$ signal should stay at a low-voltage level during the whole operation of the ON pulse to avoid short-circuit current. After termination of the ON pulse, $M_{1G}$ is driven to a high logic level. The switching process repeats after supplying opening pulse to the power transistor 11.2. The dead-time $t_{HL}$ is created between the termination of the ON pulse for power transistor 11.1 and the triggering of power transistor 11.2, which could be any arbitrary number not depending on a delay of a circuit element. The adjustment of $t_{HL}$ could be realized either by varying the duty-cycle of $M_{4G}$, either by changing the duration of the ON pulse via $R_{fb}$.

The duration of the $M_{1G}$ signal can be finally adjusted by the value of the feedback resistance $R_{fb}$. A shorter time duration is achieved with smaller $R_{fb}$ resistor. A pulse duration that is shorter than optimum causes body-diode conduction and a respective efficiency loss. The body-diode conduction is seen as a negative pulse around the high-to-low voltage transition in the $V_x$ node voltage. Longer than optimum pulse duration may cause simultaneous conductions of all power transistors, leading again to deteriorated efficiency. The pulse duration, respectively the feedback resistor $R_{fb}$, can be adjusted electronically to achieve optimum converter performance.

Figure 7:
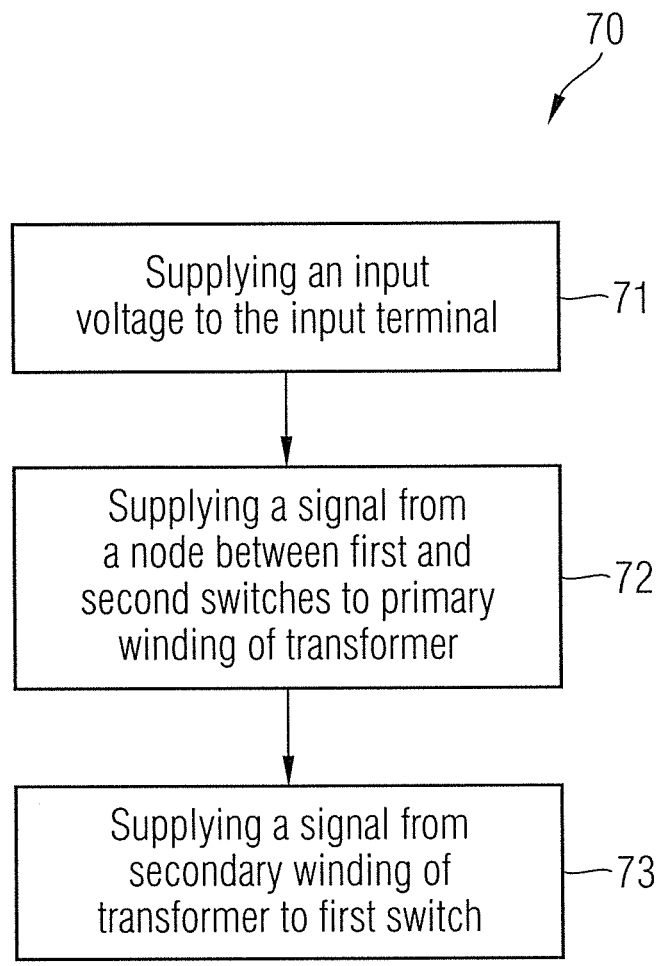
FIG. 7 illustrates a flow diagram for an exemplary method for operating a switched mode power supply according to the disclosure.

FIG. 7 illustrates a flow diagram of an exemplary method for operating a switched mode power supply according to the disclosure, the switched mode power supply comprising a first switch connected to an input terminal, a second switch, an inductor, an output capacitor, and a transformer comprising a primary winding and a secondary winding. The method 70 comprises supplying an input voltage to the input terminal 71, supplying a signal from a node between the first and second switches to the primary winding of the transformer 72, and supplying a signal from the secondary winding of the transformer to the first switch 73.

It is to be understood that each one of the manifold features and embodiments that were described above in connection with FIGS. 1-6 can be applied to the method 70 of FIG. 7.

In particular, method 70 may further comprise supplying the signal directly from the secondary winding to a control terminal of the first switch, in particular to a gate electrode of a power transistor which was shown above in the exemplary switched mode power supplies of FIGS. 1, 3 and 4.

Alternatively, method 70 may further comprise shaping the signal from the secondary winding to a square-wave signal and thereafter supplying the square-wave signal to a control terminal of the first switch like, for example, a gate electrode of a power transistor, as it was shown above in connection with the exemplary switch mode power supplies of FIGS. 5 and 6.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A switched mode power supply, comprising:
   a first switch coupled to an input terminal configured to receive an input voltage, a second switch, an inductor and an output capacitor, wherein the first switch and the second switch are coupled together at a node, the inductor is coupled between the node and an output terminal, and the output capacitor is coupled to the output terminal;
   a transformer coupled between a control input of the first switch and the node; and
   a pulse generator connected to a control input of the second switch,
   wherein the transformer comprises a primary winding and a secondary winding, the switched mode power supply further comprising:
      a first capacitor and a second capacitor, wherein the first capacitor is connected between the primary winding and an input node terminal, and the second capacitor is connected between the secondary winding and the input node, and
      wherein the input node is configured to receive a predetermined potential that is different than the input voltage.

2. The switched mode power supply according to claim 1, wherein the primary winding of the transformer is connected to the node between the first switch and the second switch, and the secondary winding of the transformer is connected to the control input of the first switch.

3. The switched mode power supply according to claim 1, further comprising:
   a third switch and a fourth switch, wherein
      the third switch is connected between the first switch and the node, and the fourth switch is connected between the second switch and the node.

4. The switched mode power supply according to claim 3, wherein the third switch and the fourth switch each have a control input connected to an input node configured to receive a voltage being half of the input voltage.

5. The switched mode power supply according to claim 1, wherein the pulse generator comprises a pulse width modulator.

6. The switched mode power supply according to claim 1, wherein the pulse generator is connected to an input node configured to receive a voltage being half of the input voltage.

7. The switched mode power supply according to claim 1, further comprising:
   an auxiliary voltage source and an auxiliary resistor, wherein the auxiliary voltage source is connected between the auxiliary resistor and the input terminal, and the auxiliary resistor is connected between the auxiliary voltage source and the control input of the first switch.

8. The switched mode power supply according to claim 7, wherein the transformer is connected to another node between the auxiliary resistor and the control input of the first switch.

9. The switched mode power supply according to claim 1, wherein the primary winding is connected in parallel to the inductor.

10. The switched mode power supply according to claim 9, further comprising:
    a capacitor connected between the secondary winding and the input terminal.

11. The switched mode power supply according to claim 1, wherein the primary winding of the transformer comprises the inductor.

12. The switched mode power supply according to claim 11, further comprising:
    a capacitor connected between the secondary winding and the input terminal.

13. The switched mode power supply according to claim 1, further comprising:
    a pulse forming unit connected between the transformer and the first switch.

14. The switched mode power supply according to claim 13, the switched mode power supply further comprising:
    a first capacitor connected between the secondary winding of the transformer and the input terminal.

15. The switched mode power supply according to claim 14, further comprising:
    a second capacitor connected between the secondary winding and an input node configured to receive a voltage being half of the input voltage.

16. The switched mode power supply according to claim 1, wherein the predetermined potential comprises a voltage being about half of the input voltage.

17. A DC to DC converter, comprising:
a first switch connected to an input terminal configured to receive an input voltage, a second switch coupled to the first switch at a node, an inductor, an output capacitor, a transformer, and a pulse generator, wherein the first switch is coupled via a first line to the node, the second switch is coupled via a second line to the node and the inductor is coupled via a third line to the node and is coupled between the node and an output terminal, wherein the first line, the second line and the third line are distinct and the output capacitor is coupled to the output terminal;
wherein the transformer is connected to a control input of the first switch and to the node between the first switch and the second switch;
wherein the pulse generator is connected to a control input of the second switch;
wherein the transformer comprises a primary winding and a secondary winding, the switched mode power supply further comprising:
a first capacitor and a second capacitor, wherein the first capacitor is connected between the primary winding and an input node terminal, and the second capacitor is connected between the secondary winding and the input node, and
wherein the input node is configured to receive a predetermined potential that is different than the input voltage.

18. The DC to DC converter according to claim 17, further comprising:
an auxiliary voltage source and an auxiliary resistor, wherein the auxiliary voltage source is connected between the auxiliary resistor and the input terminal, and the auxiliary resistor is connected between the auxiliary voltage source and the control input of the first switch, and
the transformer is connected to another node between the auxiliary resistor and the control input of the first switch.

19. The DC to DC converter according to claim 17, wherein the primary winding of the transformer is connected in parallel to the inductor, and further comprising a capacitor connected between the secondary winding of the transformer and the input terminal.

20. The DC to DC converter according to claim 17, wherein the secondary winding of the transformer comprises the inductor, and further comprising a capacitor connected between the secondary winding of the transformer and the input terminal.

21. The DC to DC converter according to claim 17, and further comprising a pulse forming unit connected between the secondary winding of the transformer and the control input of the first switch.

22. The DC to DC converter according to claim 17, wherein the predetermined potential comprises a voltage being about half of the input voltage.

23. A switched mode power supply, comprising:
a first switch and a second switch, wherein the first switch is configured to switch an input potential voltage to a node between the first and second switches, and wherein the second switch is configured to switch a ground potential to the node between the first and second switches;
a pulse generator configured to drive the second switch with a pulse width modulated signal;
an LC filter comprised of an inductor and an output capacitor, the LC filter configured to filter a signal obtained from the node between the first and second switches and supply the filtered signal to an output terminal; and
a transformer configured to feed back a signal from the node between the first and second switches and drive the first switch with the fed back signal, wherein the transformer comprises a primary winding and a secondary winding;
a first capacitor and a second capacitor, wherein the first capacitor is connected between the primary winding and an input node terminal, and the second capacitor is connected between the secondary winding and the input node terminal, and
wherein the input node terminal is configured to receive a voltage being half of the input voltage.

* * * * *